United States Patent
Ocker et al.

[11] Patent Number: 5,529,627
[45] Date of Patent: Jun. 25, 1996

[54] COATING APPARATUS

[75] Inventors: Berthold Ocker, Hanau; Mark Saunders, Rodenbach, both of Germany

[73] Assignee: Leybold Aktiengesellschaft, Hanau, Germany

[21] Appl. No.: 431,374

[22] Filed: Apr. 28, 1995

[30] Foreign Application Priority Data

Apr. 30, 1994 [DE] Germany .......................... 44 15 232.9

[51] Int. Cl.⁶ .................................................. C23C 14/35
[52] U.S. Cl. .............. 118/623; 204/192.12; 204/298.14; 204/298.02
[58] Field of Search .................................... 118/621, 623, 118/723 R; 204/192.12, 298.02, 298.14, 298.16

[56] References Cited

U.S. PATENT DOCUMENTS

| | | | |
|---|---|---|---|
| 4,619,755 | 10/1986 | Hessberger et al. | 204/298 |
| 4,824,545 | 4/1989 | Arnold et al. | 204/298 |
| 4,946,576 | 8/1990 | Dietrich et al. | 204/298.14 |
| 5,126,033 | 6/1992 | Szczyrbowski et al. | 204/298.14 |
| 5,427,665 | 6/1995 | Hartig et al. | 204/298.14 |

FOREIGN PATENT DOCUMENTS

| | | |
|---|---|---|
| 4107505 | 9/1992 | Germany . |
| 9013137 | 11/1990 | WIPO . |

Primary Examiner—Jeffrey R. Snay
Attorney, Agent, or Firm—Felfe & Lynch

[57] ABSTRACT

The inside of a coating chamber (2) has a sputtering cathode (3) bearing a magnet set (6) and having a pot-shaped electrode (4) and a target (5). The electrode (4) is closed on the side facing away from the target (5) by a cover (11) to form a pressure equalizing chamber (12). The latter has a vacuum connection (13) for establishing a vacuum acting against the vacuum in the coating chamber (2).

5 Claims, 2 Drawing Sheets

COATING APPARATUS

BACKGROUND OF THE INVENTION

The invention relates to a coating apparatus with a sputtering cathode bearing a set of magnets and disposed within a coating chamber, which has an electrode insulated electrically from the coating chamber and connected to negative potential, and in which the target forming the material to be sputtered is fastened on the side of the electrode facing away from the magnet set, while on the side of the electrode facing away from the target a pressure equalizing chamber is provided which has a vacuum connection for establishing a vacuum counteracting the vacuum in the coating chamber.

A coating apparatus of this kind is the subject of WO 90/13137. In sputtering cathodes used in such coating apparatus and known as "magnetron cathodes," it is desirable for a very strong magnetic field to act on the target surface. Therefore, the distance between the magnet set and the target should be as small as possible, and this requires that the electrode wall to be as thin as possible. In order to avoid the danger that the cathode together with the target might bend in the case of great pressure differences and great target surface areas, the known cathode has on its side facing away from the target a pressure equalizing chamber in which the same vacuum prevails as in the coating chamber.

Unsolved in the known coating apparatus is the problem of the formation of undesired secondary plasmas at the back of the sputtering cathode. Also, the known coating apparatus is relatively small, and in it the coating chamber has the same cross section as the pressure equalizing chamber.

SUMMARY OF THE INVENTION

The invention is addressed to a coating coating chamber having substantially larger cross section in relation to the cathode, wherein formation of undesired secondary plasmas cannot occur.

In accordance with the invention the electrode is pot-shaped and the pressure equalizing chamber is formed by a cover on the pot-shaped electrode, the cover being made of metal and connected to the back of the electrode without electrical insulation.

Such a coating apparatus is very simple in design and makes it possible to insert into the wall a coating chamber of large cross section. Due to the pot shape of the electrode and to the cover on it, the pressure equalization chamber can be constructed very simply. In the simplest case this cover can be a plate. Due to the interposition of electrical insulation in one wall of the coating chamber, and to the fact that the cover is made of metal, undesirable secondary plasmas on the back of the sputtering cathode are reliably prevented in a simple manner.

Any risk of accident by touching the cover or parts of the sputtering cathode can be excluded if a shield reaches over the cover at a distance therefrom, which is electrically connected with the wall of the coating chamber.

The pressure in the pressure equalizing chamber can be matched to the pressure in the coating chamber, and this is necessary especially when the coating chamber is evacuated and vented, if according to another embodiment of the invention the vacuum connection is attached to a vacuum pump and a system is provided for controlling the pressure according to the pressure in the coating system.

The pressure in the pressure equalizing chamber will positively adapt to the pressure in the coating chamber if the vacuum connection is directly attached to the coating chamber and a microfilter is disposed within this connection. The microfilter prevents any impurities from the pressure equalizing chamber from reaching the coating chamber through its connection to the latter.

The coating apparatus is configured very simply if the connection is a metal duct passing through the wall of the coating chamber and leading sealingly into the interior of an insulator fastened to the electrode or to the cover, the interior of which has a connection to the vacuum valve.

DETAILED DESCRIPTION OF THE PREFERRED EMBODIMENTS

Figure 1:
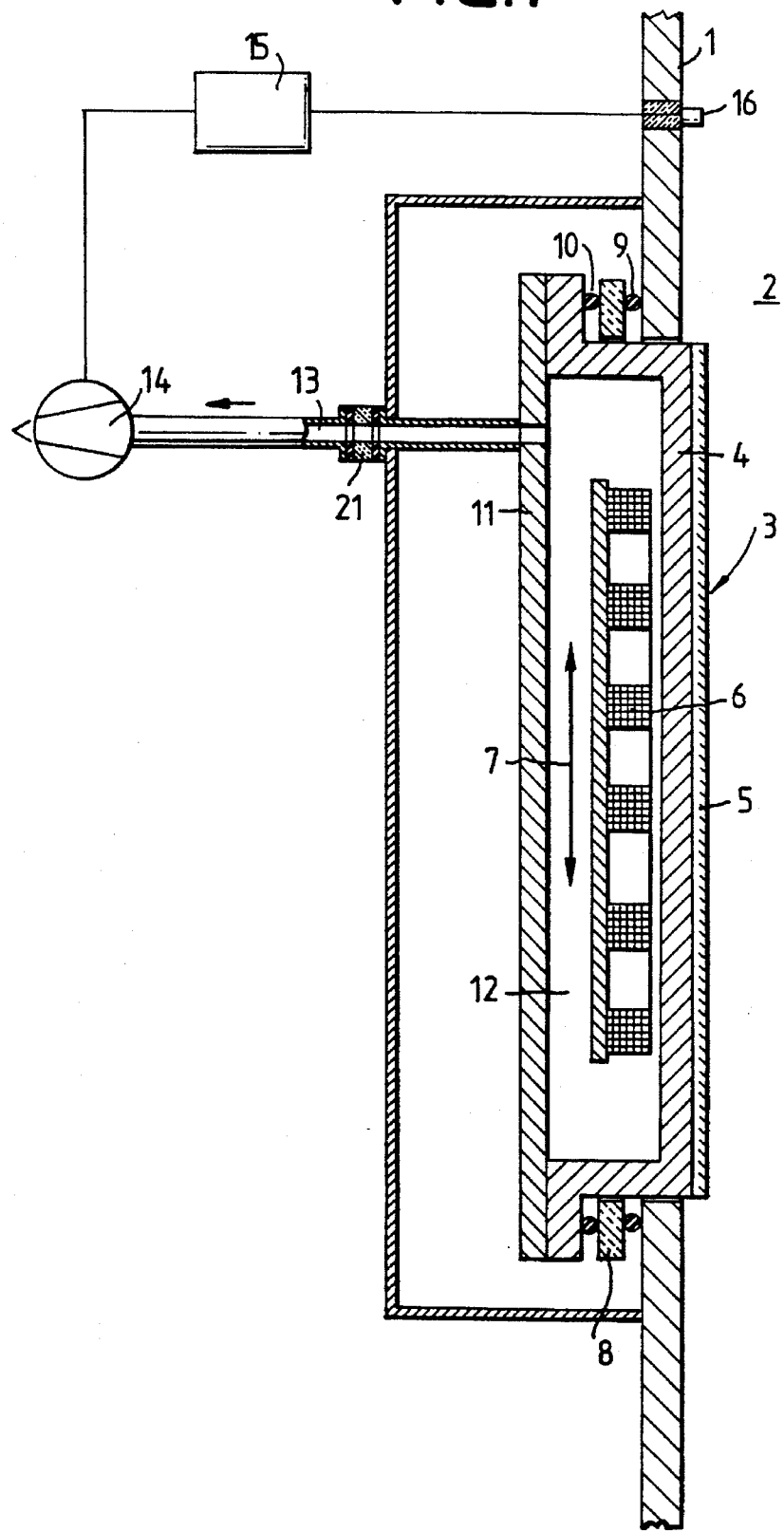
FIG. 1 is a section through a wall of a coating chamber with a sputtering cathode.

FIG. 1 shows a portion of a wall 1 which separates a coating chamber from the atmosphere. This wall 1 holds a sputtering cathode 3 which consists essentially of a pot-shaped electrode 4, a target 5 and a set of magnets 6. The magnet set 6 is movable behind the electrode 4 within its pot-shaped range, which has been indicated by a double arrow 7. This movement serves to produce a homogeneous coating on a stationary substrate opposite the target 5 but not shown.

The sputtering cathode 3 is separated electrically from the wall 1 by an insulator 8, so that it can be connected to a negative potential and the wall 1 to ground. Gaskets 9 and 10 prevent the entry of air into the coating chamber 2 in the area of the sputtering cathode 3.

It is important to the invention that the electrode 4 is sealed gas-tight on its side facing away from the target 5 by a cover 11, which in this embodiment is flat, so that within the electrode 4 a pressure equalizing chamber 12 is formed in which the magnet set is located. This pressure equalizing chamber 12 has a vacuum connection 13 on the cover 11, which is connected to a vacuum pump 14 with the interposition of an insulator 21. A pressure regulating system 15, which is connected with a pressure sensor 16 disposed in the coating chamber, is able to regulate the pressure in the pressure equalization chamber 12 so that it corresponds to that in the coating chamber 2.

The cover 11 consists preferably of metal and is electrically connected to the electrode 4. This prevents secondary plasmas from forming in the pressure equalizing chamber 12. The possibility that cover 11 and the back of the electrode 4 might come in contact is prevented by a shield 17 which is disposed at a sufficient distance from the cover 11 and the electrode 4, is made of metal and is electrically connected to the wall 1.

Figure 2:
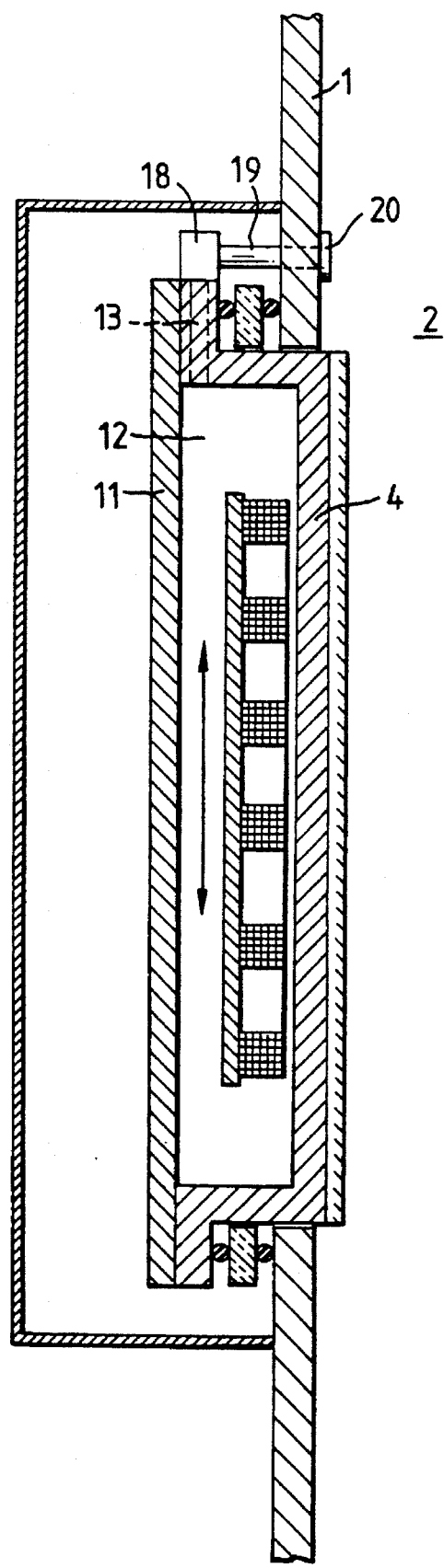
FIG. 2 is a section through a wall of a second embodiment of a coating chamber with a sputtering cathode.

The embodiment in FIG. 2 differs from that in FIG. 1 by the different way in which the application of pressure to the pressure equalizing chamber 12 is performed. For this purpose the vacuum connection 13 leads into an insulator 18 out of which a duct 19 leads through the wall 1 into the coating chamber 2. This duct 19 is provided with a microfilter 20.

We claim:

1. Coating apparatus comprising a sputtering cathode bearing a set of magnets and disposed within a coating chamber, said cathode comprising an electrode bearing said set of magnets and connected to negative potential and insulated electrically from the coating chamber, and wherein a target constituting the material to be sputtered is fastened on the side of the electrode facing away from the magnet set, a pressure equalizing chamber being provided on the side of the electrode facing away from the target, which pressure equalizing chamber has a vacuum connection to adjust a vacuum counteracting the vacuum in the coating chamber, wherein the electrode is pot-shaped and the pressure equalizing chamber is formed by a cover closing the pot-shaped electrode, which cover is made of metal and is connected without electrical insulation to the back of the electrode.

2. Coating apparatus according to claim 1, further comprising a shield which reaches over the cover and is electrically connected to the wall of the coating chamber.

3. Coating apparatus according to claim 1 wherein the vacuum connection is connected with a vacuum pump and a pressure regulating system is provided for controlling the pressure in the pressure equalizing chamber according to the pressure in the coating chamber.

4. Coating apparatus according to claim 1 wherein the vacuum connection has a direct connection to the coating chamber and wherein a microfilter is disposed in said connection.

5. Coating apparatus according to claim 4, wherein the direct connection comprises a duct of metal passing through the wall of the coating chamber, and leading sealingly into one of the interior of an insulator fastened to the electrode and the cover, the interior of the insulator being connected to the vacuum connection of the pressure equalizing chamber.

* * * * *